United States Patent
Yousef et al.

(10) Patent No.: US 11,611,205 B2
(45) Date of Patent: Mar. 21, 2023

(54) TRIGGERING CIRCUIT AND ELECTRONIC FUSE DEVICE INCORPORATING THE SAME

(71) Applicant: Aptiv Technologies Limited, St. Michael (BB)

(72) Inventors: Sebastian Yousef, Dublin (IE); Pekka Herzogenrath, Dublin (IE)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 17/404,763

(22) Filed: Aug. 17, 2021

(65) Prior Publication Data
US 2022/0060011 A1 Feb. 24, 2022

(30) Foreign Application Priority Data
Aug. 18, 2020 (EP) .................................. 20191585

(51) Int. Cl.
*H02H 3/00* (2006.01)
*H02H 3/08* (2006.01)
*H02H 1/00* (2006.01)
*H03K 5/24* (2006.01)

(52) U.S. Cl.
CPC ............ *H02H 3/08* (2013.01); *H02H 1/0007* (2013.01); *H03K 5/24* (2013.01)

(58) Field of Classification Search
CPC ........... H02H 3/08; H02H 1/0007; H03K 5/24
USPC ........................................................ 361/87
See application file for complete search history.

(56) References Cited

U.S. PATENT DOCUMENTS

| | | | |
|---|---|---|---|
| 7,792,553 B2 * | 9/2010 | Fukui ...................... | H04Q 9/00 455/574 |
| 10,090,751 B1 | 10/2018 | Tsyrganovich et al. | |
| 2006/0100724 A1 * | 5/2006 | Miura ................ | H04N 1/00209 700/79 |
| 2016/0197602 A1 * | 7/2016 | Joos ....................... | H02H 3/202 361/33 |
| 2017/0110874 A1 * | 4/2017 | van Dijk .................. | H02H 3/08 |
| 2018/0287365 A1 | 10/2018 | Djelassi-Tscheck et al. | |

FOREIGN PATENT DOCUMENTS

| | | |
|---|---|---|
| EP | 1150410 | 10/2001 |
| EP | 3159992 | 4/2017 |

OTHER PUBLICATIONS

"Extended European Search Report", EP Application No. 20191585.7, Feb. 4, 2021, 8 pages.

* cited by examiner

*Primary Examiner* — Jared Fureman
*Assistant Examiner* — Lucy M Thomas
(74) *Attorney, Agent, or Firm* — Sawtooth Patent Group PLLC

(57) ABSTRACT

A triggering circuit and an electronic fuse device incorporating the same. The triggering circuit works with a microcontroller to control a load. The microcontroller has a low-power mode and an external interrupt input for triggering wakeup from the low-power mode and initiating an interrupt action related to the load. The triggering circuit comprises a sensor input for receiving a sensor signal related to the load, a threshold input for receiving a threshold reference signal, and a comparator for comparing the sensor signal to the threshold reference signal and for outputting an interrupt signal to the external interrupt input in response to the comparison.

20 Claims, 3 Drawing Sheets

TRIGGERING CIRCUIT AND ELECTRONIC FUSE DEVICE INCORPORATING THE SAME

CROSS-REFERENCE TO RELATED APPLICATION

This application claims priority to European Patent Application Number 20191585.7, filed Aug. 18, 2020, the disclosure of which is hereby incorporated by reference in its entirety herein.

INTRODUCTION

The present disclosure relates to a triggering circuit and to an electronic fuse device incorporating the triggering circuit. The present disclosure is particularly relevant to a triggering circuit for use in conjunction with a microcontroller for overcurrent protection in automotive applications.

BACKGROUND

Most electronic systems require fuse or circuit breaker devices to provide overcurrent protection against excess currents caused by short circuits or other malfunctions. In automotive applications, these fuse systems are particularly important for maintaining the vehicle's electronic safety systems, with these being especially critical in vehicles having autonomous driving systems.

Historically, fuse systems included a fuse board having an array of melting fuses. Such melting fuses provide a low-ohmic current path, which is heated and melts when the passed current exceeds a threshold to thereby prevent damage to the connected load. However, such systems are relatively space inefficient and require new fuses each time an overcurrent event occurs. As such, there has been a move toward circuit breaker systems and, more recently, to electronic fuse systems which include an integrated circuit having both current measurement functionality and logic for controlling transistor switches to disconnect loads when detected currents exceed a threshold. At the same time, such integrated circuit controllers will often also be used to switch loads on and off during normal operation. As such, these controllers are therefore commonly referred to as "smart output drivers" because they drive the transistor switching for the electric supply modules during both normal operation and in an overcurrent event. Although conventional smart output drivers are effective, they have a number of shortcomings.

Firstly, smart output drivers lack flexibility because each driver can only be used within a certain current domain. That is, the design of an integrated circuit for a smart output driver is optimized for use within a certain current range, and it is impractical to combine both low and high currents drivers due to inherent differences in their design and the manufacturing processes required to make them. This also limits the capabilities of the integrated logic block. That is, although basic features such as warning and flexible current windows may be implemented, they cannot implement the additional logical capabilities and ongoing current monitoring diagnostics that more advanced safety microcontrollers may require.

Secondly, smart output drivers dissipate power while monitoring currents, which makes them relatively inefficient if the vehicle's electronics are switched to a low-power mode. That is, the need to continuously monitor currents to safely switch off a current path if an overcurrent event occurs means that parasitic power consumption is relatively high. Although different methods for monitoring current have been used, all inherently rely on an intelligent component remaining in an active mode to provide the monitoring function. As such, quiescent current demands for the whole module are typically unacceptably high for automotive applications because the idle current draw may exceed the original equipment manufacturer's requirements.

There therefore remains a need for an improved electronic fuse device for providing a safe and reliable electronic power supply.

SUMMARY

The present disclosure concerns a triggering circuit for use with a microcontroller to provide an electronic fuse device to protect loads from overcurrent. The triggering circuit may be for use with a safety microcontroller for automotive applications.

According to a first aspect, there is provided a triggering circuit for use with a microcontroller used to control a load when in an active mode, and having a low-power mode and an external interrupt input for triggering wakeup from the low-power mode and initiating an interrupt action related to the load, the triggering circuit comprising: a sensor input for receiving a sensor signal related to the load; a threshold input for receiving a threshold reference signal; and comparator for comparing the sensor signal to the threshold reference signal and for outputting an interrupt signal to the external interrupt input in response to the comparison.

In this way, the triggering circuit may utilize analog circuitry to provide a low-latency response to a load event, such as an overcurrent event. In response, the microcontroller can be activated and digitally determine a suitable response. Accordingly, a triggering arrangement may be provided which combines the low quiescent current demands of an analog monitoring circuit, with the flexibility and processing capabilities of a microcontroller. As such, the triggering circuit may be used, for example, with a vehicle's safety microcontroller to achieve low power consumption when the vehicle's engine is turned off, whilst still allowing action to be rapidly initiated in response to an overcurrent event for those loads which are maintained while the microcontroller is in sleep mode.

In embodiments, the microcontroller is an electronic fuse for disconnecting the load from a power source in response to an overcurrent event. In this way, a rapid response to a current overload may be provided, even when the microcontroller is in a low power mode.

In embodiments, the sensor signal corresponds to a current drawn through a current path from the power source. In this way, a current sensor is provided for detecting overcurrent event. The sensor may also be used for monitoring current draw characteristics.

In embodiments, the current sensor comprises a shunt resistor or hall sensor.

In embodiments, the triggering circuit further comprises a switch operable to connect or disconnect the load from the power source in response to an output from the microcontroller. In this way, the switch may be integrated into the triggering circuit. In alternative embodiments, the triggering circuit may control an external switch.

In embodiments, the triggering circuit further comprises a latch for holding the switch to maintain connection of the load to the power source when the microcontroller is in a low-power mode. In this way, the microcontroller is not required to actively drive the switch to maintain connection of the load.

In embodiments, the switch is a transistor and the output from the microcontroller controls the transistor's gate. For example, the switch may be a MOSFET or other type of transistor.

In embodiments, the sensor input further comprises a monitoring bypass around the comparator for transmitting the sensor signal to the microcontroller for monitoring by the microcontroller when in an active mode. In this way, the microcontroller may monitor the sensor measurement when activated for, for instance, diagnostic purposes.

According to a second aspect, there is provided an electronic fuse device comprising: a triggering circuit according to any one of above statements; and a microcontroller for controlling the load when in an active mode, and having a low-power mode and an external interrupt input for triggering wakeup from the low-power mode and initiating an interrupt action related to the load.

In embodiments, the external interrupt input comprises a Non-Maskable-Interrupt, NMI, input.

In embodiments, the electronic fuse device further comprises an Analog to Digital Converter (ADC) module for converting the sensor signal into a digitised sensor signal for the microcontroller. In this way, the microcontroller may directly monitor the sensor measurements.

In embodiments, the electronic fuse device further comprises a threshold generating module for generating the threshold reference signal based on a threshold output set by the microcontroller. In this way, the threshold may be conveniently varied depending on, for example, the specific load or other load circuit requirements.

In embodiments, the threshold generating module comprises one of a Digital to Analog Converter (DAC) module and a Pulse Width Modulation (PWM) module. A PWM module provides for implementation using a timer module, which thereby helps to minimise current demands during low power modes by avoiding the need for continuous execution by a processor.

In embodiments, the device comprises a plurality of triggering circuits. In this way, a plurality of loads may be independently monitored by a single microcontroller.

In embodiments, the microcontroller generates respective threshold reference signals for each of the plurality of triggering circuits. In this way, loads operating within different current domains may be monitored using the same microcontroller. For example, the same safety microcontroller may monitor both high and low power load circuits.

Various processes and methods can be performed relying on the described embodiments. For example, in embodiments, a method includes operating a microcontroller of a system in an active mode for controlling a load, and while operating the microcontroller in a low-power mode, receiving, by the microcontroller, an external interrupt input generated by a triggering circuit of the system based on a comparison of a sensor signal related to the load and a threshold reference signal received by the triggering circuit. The method includes responsive to receiving the external interrupt input generated by triggering circuit, waking the microcontroller out of the low-power mode to perform an interrupt action related to the load.

BRIEF DESCRIPTION OF DRAWINGS

Illustrative embodiments will now be described with reference to the accompanying drawings in which.

DETAILED DESCRIPTION

Figure 1:
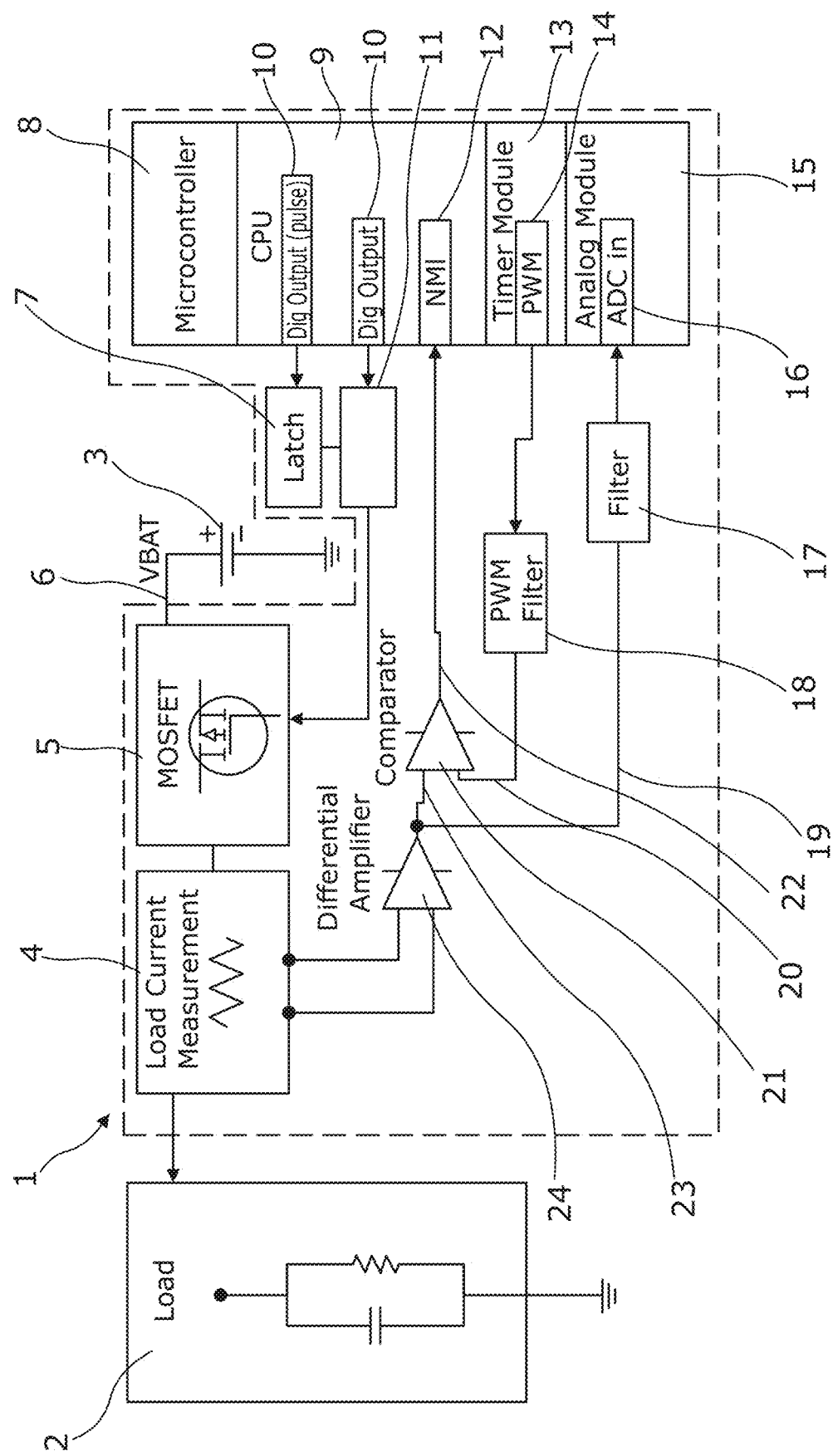
FIG. 1 shows a simplified circuit diagram of the electronic fuse device according to a first embodiment.

FIG. 1 shows a simplified circuit diagram of an electronic fuse device 1 according to a first embodiment which incorporates an analog triggering circuit and a microcontroller 8. The electronic fuse device 1 is used to control the switching of the current path 6 between a load 2 and a battery 3 by operating a switch, in the form of MOSFET 5, in response to the current detected by current measurement sensor 4.

The switching of MOSFET 5 is controlled through a gate driver 11 which is controlled through the digital output 10 of the microcontroller 8. As such, when the MOSFET 5 is ON, the current path 6 between the load 5 and the battery 3 is established to allow the load to draw power. A latch 7 is further provided and is operable to lock the MOSFET in the ON state in response to a pulse signal from the digital output 10.

Load current measurement sensor 4 is connected along the current path 6 for monitoring the current level drawn by the load 2. The current measurement sensor may be provided as a shunt resistor or hall effect sensor arrangement. In this embodiment, the current measurement sensor 4 further comprises a differential amplifier 24 which outputs a current sensor signal to a first input 23 of the comparator 21. The current sensor signal is provided in the form of a voltage level proportional to the sensed current level.

The comparator 21 compares the voltage level of the current sensor signal with the voltage level of a threshold signal applied through a second input 20. If the current sensor signal exceeds the threshold, the comparator 21 outputs a digital interrupt signal through interrupt output 22. In this embodiment, the threshold signal is generated using a pulse width modulated (PWM) signal 14 output by a timer module 13 within the microcontroller 8. The PWM signal 14 is filtered through a PWM filter 17 (e.g. a low-pass filter). Once filtered, the output threshold signal voltage is proportional to the duty cycle of the original PWM signal 14. As such, the microcontroller 8 may adjust the current threshold at which the interrupt signal is output by instructing the timer module 13 to vary the duty cycle of the PWM signal 14. This thereby allows a digital PWM signal 14 to be converted to a suitable analog input for the comparator 21. Once set, the timer module 13 may maintain the PWM signal 14 without requiring continuous processing execution by the microcontroller. As such, the threshold signal can be maintained with minimal power demands. It will be understood that other arrangements may be used to generate a suitable analog threshold signal from the microcontroller 8, such as Digital to Analog Converter (DAC) module within the microcontroller 8.

The output from the current sensor 4 is provided with a further bypass connection 19, which connects from the output of differential amplifier 24 to an Analog to Digital Converter (ADC) input 16 within an analog module 15 of the microcontroller 8. The bypass connection 19 bypasses the comparator 21 and feeds through a serial filter 17 to provide current sensor feedback to the microcontroller 8.

The interrupt output 22 of the comparator 21 is connected to a Non-Maskable Interrupt (NMI) terminal 12 of the microcontroller 8. As such, when the comparator 21 outputs a digital interrupt signal, activation of the NMI triggers the microcontroller 8 to undertake a diagnostic response action, irrespective of its current state. Consequently, even if the microcontroller 8 is in a sleep mode, application the interrupt signal to the NMI terminal 12 prompts a rapid hardware interrupt, forcing the microcontroller 8 to wake and initiate a diagnostic protocol on the sensed current being drawn by the load 2. If an overcurrent situation is then diagnosed, the microcontroller 8 can output a switch signal through gate driver 11 to turn off the MOSFET 5 and thereby disconnect the load 2. This thereby provides a low-latency interrupt which may prioritize a current diagnostic protocol whenever the detected current exceeds the threshold set by the microcontroller 8 through the PWM signal 14.

Operation of the device 1 during various scenarios will now be described in reference to FIGS. 2 to 4.

Figure 2:
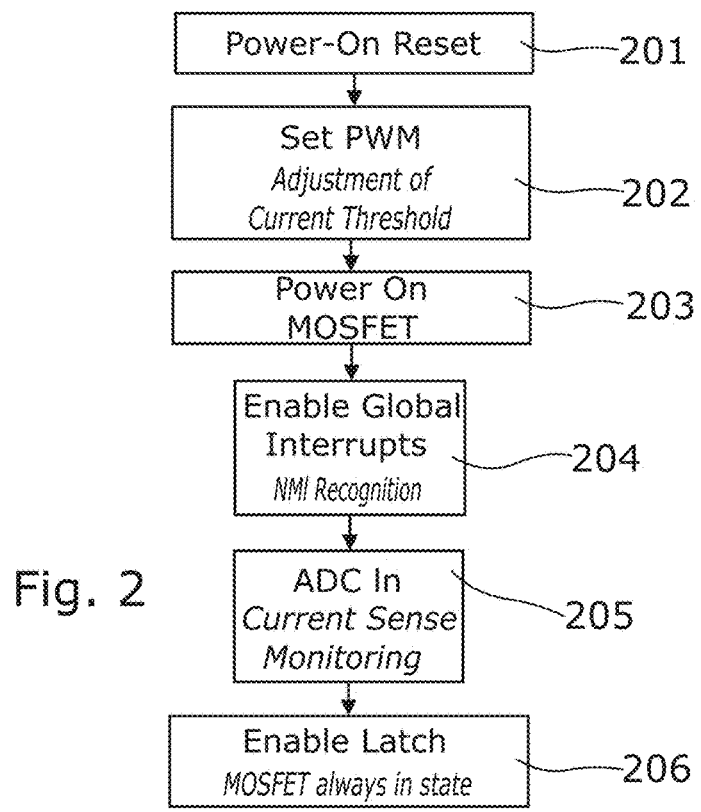
FIG. 2 shows a flow diagram of a start-up operation process using the electronic fuse device shown in FIG. 1.

FIG. 2 shows flow diagram of a start-up operation process when the electronic fuse device shown in FIG. 1 is first turned on or reset. In step 201, the microcontroller software is turned on, which then initiates a configuration routine 202 in which the PWM signal output by the timer module 13 is set to provide a suitable current threshold. For example, the threshold may be selected according to system design parameters such as attached loads, load types and wiring harness dimensions. Once the configuration routine 202 has completed, in step 203, the MOSFET 5 is activated by the microcontroller 8. The microcontroller's interrupt functions are also then enabled (step 204), which activates sensing of the interrupt signal through the NMI terminal 12. At this stage 205, the microcontroller 8 may then monitor the flowing current, for example, at designated time intervals, using the ADC input 16. The latch 7 may also be activated in step 206 to keep the load 2 powered, even if the microcontroller 8 is ramped down during sleep mode.

Figure 3:
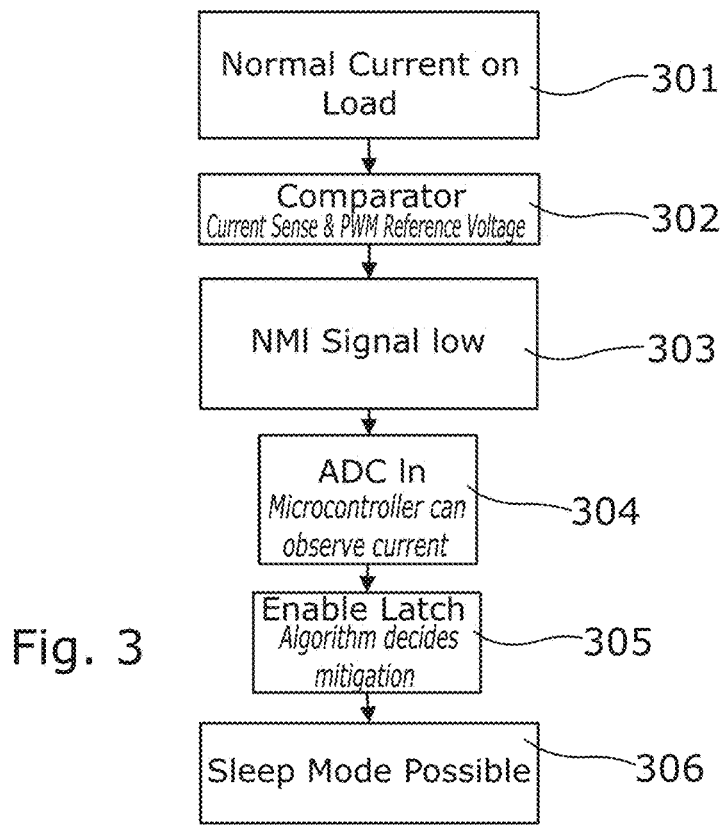
FIG. 3 shows a flow diagram of operations of the electronic fuse device of FIG. 1 during normal current conditions.

FIG. 3 shows a flow diagram of operating steps of the electronic fuse device during the microcontroller's active mode 301 under normal current conditions. In this scenario, the amount of current flowing through path 6 is below the threshold and therefore the comparator 21 does not output the interrupt signal and hence the NMI terminal 12 is not activated (steps 302 and 303). As such, the microcontroller 8 monitors the current flowing using the ADC input 16 in intervals, as needed (step 304) and the latch 7 may be activated in step 305 to hold the MOSFET 5 in an ON state. The microcontroller's software may also decide to leave the system in this active mode (e.g., permanently), or transfer itself into a lower powered sleep mode (step 306).

Figure 4:
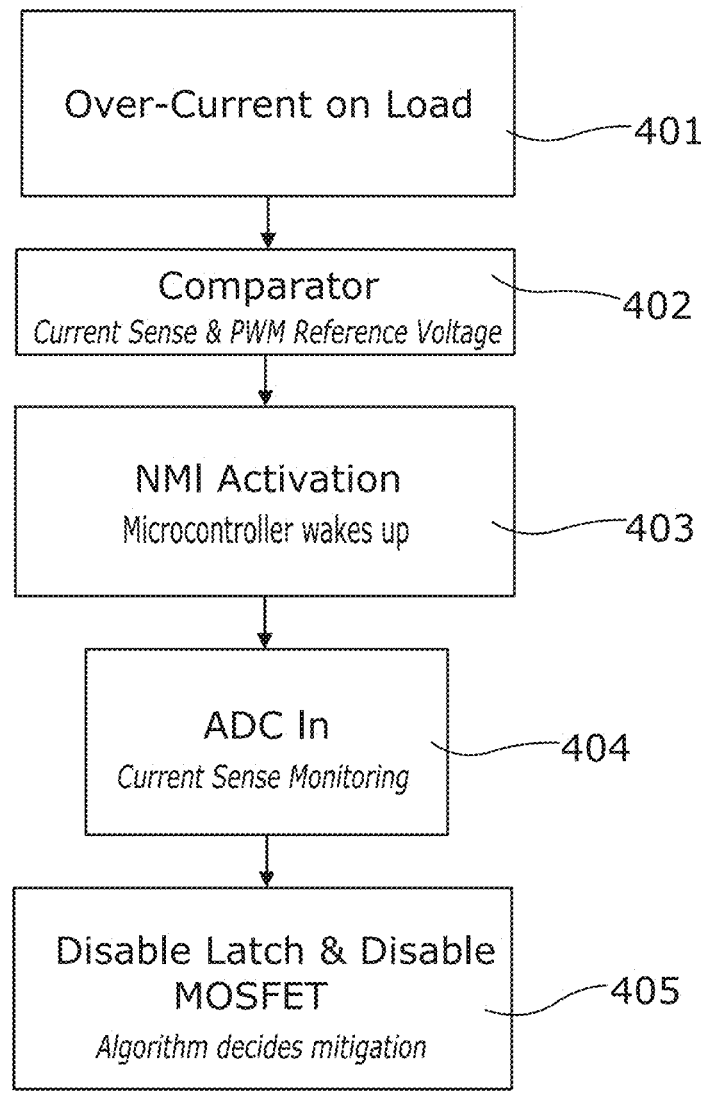
FIG. 4 shows a flow diagram of operations of the electronic fuse device of FIG. 1 in an overcurrent scenario.

FIG. 4 shows a flow diagram of the operational steps of the electronic fuse device 1 in an overcurrent scenario, for instance because of a short circuit occurrence. In this situation, the overcurrent event (step 401) causes the comparator 21 to output an interrupt signal to NMI terminal 12, which activates the NMI routine in step 403 and forces the microcontroller 8 to wake up. This also raises a digital flag in the interrupt system of microcontroller 8, invoking an interrupt service routine which prompts the microcontroller 8 to read out the ADC input 16 and determine the nature of the mitigation procedure that should then take place. For example, if the characteristics of the current sensor signal indicate a continuous overcurrent, the microcontroller software may rapidly switch off the MOSFET 5. Alternatively, if the characteristics indicate the current peak was caused by a transient capacitive load, the microcontroller 8 may maintain the MOSFET 5 connection to maintain system availability.

Accordingly, with the above arrangement, during a normal active mode, the microcontroller 8 can monitor the load 2 using the current feedback received via the ADC input 16. As such, ongoing diagnostic functionality or complex fusing algorithms may be implemented in the microcontroller 8 to, for instance, monitor current characteristics over time. If an overcurrent event arises, the analog components provide for the rapid triggering of a protective response. Specifically, the comparator 21 responds to any increase in current above the threshold and activates the NMI 12, which triggers the microcontroller 8 to rapidly diagnose the fault based on the ADC input 16 and, if appropriate, switch the MOSFET 5 to disconnect the load 2 from the current path 6. Advantageously, this trigging action may be initiated even if the microcontroller 8 is in a low-power sleep mode. That is, the microcontroller 16 may power down active monitoring the ADC input 16 to conserve power and rely on the analog comparator to initiate an overcurrent response. Not only does this provide for low latency response times, but because the microcontroller 8 subsequently determines the response action, more sophisticated characterisation of the issue can be undertaken. For instance, momentary current spikes may be differentiated from prolonged overcurrent situations to maintain system availability whenever possible. This contrasts with the more simplistic response actions undertaken by conventional smart current drivers, which will often disconnect loads in response to any detected current spike.

The arrangement therefore allows the flexibility provided by a microcontroller 8 to be implemented, while still providing current overload protection when the microcontroller is sleep mode without substantively adding to the systems quiescent current demands. This is especially important in automotive applications where it is necessary to power down as many non-critical systems as possible when the engine is turned off, but nevertheless certain critical systems have to remain powered.

A further advantage is that the triggering threshold may be freely adjusted by the microcontroller using the PWM output signal 14, or for example using a Digital to Analog converter. The use of a PWM signal is particularly advantageous because the signal can be maintained by an internal timer module 13, without relying on continued CPU execution. This allows a low quiescent current demand to be achieved while generating the threshold signal when the microcontroller is in low power mode.

Finally, the segmentation of logical and analog power part not only allows multiple fuses to be monitored by a single microcontroller, but it also allows a single microcontroller to monitor the entire bandwidth of different vehicle currents. That is, different analog triggering circuits may be associated with different loads, with their respective thresholds set based on the respective load's characteristics.

It will be understood that the embodiments illustrated above shows an application only for the purposes of illustration. In practice, embodiments may be applied to many different configurations, the detailed embodiments being straightforward for those skilled in the art to implement.

In this connection, for example, it will be understood that the microcontroller may perform other functions in addition to its role as part of an electronic fuse device. For example, the microcontroller may be a vehicle safety microcontroller to which the triggering components are subsequently coupled. As such, existing off-the-shelf microcontroller devices may be programmed for use in embodiments. In other arrangements, embodiments may be provided as a complete electronic fuse device comprising both the digital microcontroller and one or more analog triggering circuits.

What is claimed is:

1. A system comprising:
a microcontroller, the microcontroller comprising a digital to analog converter (DAC) module or a pulse width modulation (PWM) module, configured to generate a threshold reference signal; and
a triggering circuit comprising:
a sensor input configured to receive an analog sensor signal related to a load;
a threshold input configured to receive the threshold reference signal from the microcontroller, the threshold reference signal having a variable voltage; and a comparator configured to,
compare a voltage of the analog sensor signal to a voltage of the threshold reference signal; and
output, in response to the voltage of the analog sensor signal being greater than the voltage of the threshold reference signal, an interrupt for receipt by the microcontroller; and
a digital input configured to receive a digital signal from the microcontroller, the triggering circuit configured to operate a switch to control the analog sensor signal based on the digital signal, wherein the microcontroller is configured to:
operate in a low-power mode when supplied power is limited;
responsive to receiving the interrupt, operate in the active mode;
determine, while in the active mode, a mitigation procedure based on the voltage of the analog sensor signal load; and
generate, based on the determined mitigation procedure, a corresponding digital signal for operating the switch to control the analog sensor signal.

2. The system according to claim 1, wherein the interrupt comprises a Non-Maskable-Interrupt (NMI).

3. The system according to claim 1, wherein the system further comprises an analog to digital converter configured to convert the analog sensor signal into a digitized sensor signal for the microcontroller.

4. The system according to claim 1, wherein the DAC module or the PWM module is configured to generate the threshold reference signal.

5. The system according to claim 1, wherein the determination of the mitigation procedure comprises initiating a diagnostic protocol to analyze current being drawn by the load.

6. The system according to claim 1, further comprising a plurality of triggering circuits configured to initiate respective interrupts for receipt by the microcontroller, the plurality of triggering circuits including the triggering circuit.

7. The system according to claim 6, wherein the microcontroller is further configured to generate respective threshold reference signals for the triggering circuits.

8. The system according to claim 1, further comprising the switch, wherein the switch is configured to disconnect the load from a power source based on the digital signal.

9. The system according to claim 8, wherein the analog sensor signal is received from a current sensor, and the analog sensor signal corresponds to a current drawn through a current path from the power source.

10. The system according to claim 9, wherein the current sensor comprises a shunt resistor or hall sensor.

11. A method comprising:
operating a microcontroller of a system in a low-power mode, the microcontroller comprising a digital to analog converter (DAC) module or a pulse width modulation (PWM) module;
receiving, by a triggering circuit of the system, an analog sensor signal related to a load;
generating by the microcontroller, a threshold reference signal having a variable voltage based on an output from one of the DAC module or the PWM module;
receiving, by the triggering circuit and from the microcontroller, the threshold reference signal;
comparing, by the triggering circuit, a voltage of the analog sensor signal to a voltage of the threshold reference signal;
responsive to determining that the voltage of the analog sensor signal is greater than the voltage of the threshold reference signal, outputting, by the triggering circuit and to the microcontroller, an interrupt;
responsive to receiving the interrupt, operating, by the microcontroller, in an active mode to determine a mitigation procedure based on the voltage of the analog sensor signal; and
outputting, from the microcontroller to a switch of the triggering circuit, a digital signal effective to cause the switch to control the analog sensor signal.

12. The method according to claim 11, wherein the interrupt comprises a Non-Maskable-Interrupt (NMI).

13. The method according to claim 11, further comprising:
converting, by an analog to digital converter of the system, the analog sensor signal into a digitized sensor signal for the microcontroller to determine the mitigation procedure.

14. The method according to claim 11, wherein the DAC module or the PWM module generates the threshold reference signal.

15. The method according to claim 11, wherein determining the mitigation procedure comprises:
initiating a diagnostic protocol to analyze current being drawn by the load.

16. The method according to claim 11, further comprising:
receiving, by the microcontroller, respective other interrupts from one or more other triggering circuits.

17. The method according to claim 16, further comprising:
generating, by the microcontroller, respective threshold reference signals for the other triggering circuits.

18. The method according to claim 11, further comprising:
determining, by the microcontroller, an overcurrent event, wherein outputting the digital signal is effective to cause the switch to disconnect the load.

19. The method according to claim 18, further comprising:
measuring, by a current sensor of the triggering circuit, a current drawn through a current path from the power source; and
outputting, by the current sensor and based on the current drawn, the analog sensor signal.

20. The method according to claim 19, wherein the current sensor comprises a shunt resistor or hall sensor.

* * * * *